United States Patent
Chen et al.

(10) Patent No.: US 11,239,292 B2
(45) Date of Patent: Feb. 1, 2022

(54) ARRAY SUBSTRATE, DISPLAY PANEL, DISPLAY APPARATUS AND PREPARATION METHOD THEREFOR

(71) Applicant: BOE Technology Group Co., Ltd., Beijing (CN)

(72) Inventors: Jiangbo Chen, Beijing (CN); Youngsuk Song, Beijing (CN); Wenjun Hou, Beijing (CN); Lei Zhao, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 170 days.

(21) Appl. No.: 16/476,578

(22) PCT Filed: Aug. 27, 2018

(86) PCT No.: PCT/CN2018/102580
§ 371 (c)(1),
(2) Date: Jul. 9, 2019

(87) PCT Pub. No.: WO2019/109674
PCT Pub. Date: Jun. 13, 2019

(65) Prior Publication Data
US 2019/0355763 A1    Nov. 21, 2019

(30) Foreign Application Priority Data
Dec. 6, 2017 (CN) .......................... 201711276782.1

(51) Int. Cl.
*H01L 27/32* (2006.01)
*H01L 27/12* (2006.01)

(52) U.S. Cl.
CPC ...... *H01L 27/3246* (2013.01); *H01L 27/1251* (2013.01); *H01L 27/322* (2013.01); *H01L 27/3262* (2013.01)

(58) Field of Classification Search
CPC .............................. H01L 27/12; H01L 27/32
See application file for complete search history.

(56) References Cited

U.S. PATENT DOCUMENTS

2011/0062458 A1* 3/2011 Shimoda ............. H01L 51/5284
257/88
2012/0091459 A1    4/2012 Choi et al.
(Continued)

FOREIGN PATENT DOCUMENTS

| CN | 103247659 A | 8/2013 |
| CN | 103681773 A | 3/2014 |

(Continued)

OTHER PUBLICATIONS

Office Action for corresponding Chinese Application 201711276782.1 dated May 28, 2019.
(Continued)

*Primary Examiner* — Kenneth Parker
*Assistant Examiner* — Long H Le
(74) *Attorney, Agent, or Firm* — Arent Fox LLP; Michael Fainberg

(57) ABSTRACT

Provided are an array substrate, a display panel, a display apparatus and a preparation method therefor. The array substrate comprises: a base substrate; and multiple pixel units arranged on one side of the base substrate, each of the pixel units comprising: a thin-film transistor and an electroluminescent structure, and a shading structure located between the thin-film transistor and the base substrate, wherein the thin-film transistor comprises: an active layer located on one side, away from the base substrate, of the shading structure; the electroluminescent structure comprises: first electrodes for driving the pixel units; and one of the shading structure and the active layer is a same-layer structure fabricated by the same mask plate as the first
(Continued)

electrodes so as to reduce the number of mask procedures required in preparation of an array substrate.

16 Claims, 7 Drawing Sheets

(56) References Cited

U.S. PATENT DOCUMENTS

| | | | |
|---|---|---|---|
| 2013/0032803 A1* | 2/2013 | Moon | H01L 27/3248 257/59 |
| 2013/0207087 A1 | 8/2013 | Kim et al. | |
| 2013/0320314 A1* | 12/2013 | Kim | H01L 51/52 257/40 |
| 2016/0013415 A1* | 1/2016 | Ren | H01L 27/1225 257/40 |
| 2017/0301743 A1 | 10/2017 | Yang et al. | |
| 2019/0067398 A1 | 2/2019 | Liu | |
| 2019/0081080 A1 | 3/2019 | Xie et al. | |
| 2019/0267575 A1 | 8/2019 | Liu et al. | |
| 2019/0355763 A1 | 11/2019 | Chen et al. | |

FOREIGN PATENT DOCUMENTS

| | | |
|---|---|---|
| CN | 106887438 A | 6/2017 |
| CN | 107046042 A | 8/2017 |
| CN | 206441732 U | 8/2017 |
| CN | 107170762 A | 9/2017 |
| CN | 107305907 A | 10/2017 |
| CN | 107565049 A | 1/2018 |
| CN | 107885004 A | 4/2018 |
| CN | 207489875 U | 6/2018 |

OTHER PUBLICATIONS

Chinese Office Action dated Jan. 16, 2020 in related Chinese Application No. 201711276782.1.

* cited by examiner

ARRAY SUBSTRATE, DISPLAY PANEL, DISPLAY APPARATUS AND PREPARATION METHOD THEREFOR

This application is a National Stage of International Application No. PCT/CN2018/102580, filed Aug. 27, 2018, which claims priority to Chinese Patent Application No. 201711276782.1, filed Dec. 6, 2017, both of which are hereby incorporated by reference in their entireties.

FIELD

This disclosure relates to the field of display technologies, and particularly to an array substrate, a method for fabricating the same, a display panel, and a display device.

BACKGROUND

There are generally a large number of, e.g., thirteen number of, mask processes (from a base substrate to a pixel definition layer) in a method for fabricating an array substrate of a display panel, thus complicating the fabrication process flow and increasing the process cost.

SUMMARY

An embodiment of this disclosure provides an array substrate including:
a base substrate; and
at least one pixel element on one side of the base substrate, each of the at least one of pixel element includes: a thin film transistor and an electroluminescence structure;
wherein, the thin film transistor includes a drain and an active layer;
at least one insulation layer on one side of the base substrate near the at least one of pixel element; wherein a surface of the at least one insulation away from the base substrate includes a recessed portion, and the electroluminescence structure is in the recessed portion;
each of the at least one of pixel element includes a light-emitting area, and a circuit area adjacent to the light-emitting area; wherein the thin film transistor is in the circuit area, and the electroluminescence structure is in the light-emitting area;
the active layer is between the base substrate and the at least one insulation layer;
the drain is on one side of the at least one insulation layer away from the base substrate, and the drain covers at least a portion of a sidewall of the recessed portion for preventing light emitted by the electroluminescence structure from being incident on the active layer.

Optionally in the embodiment of this disclosure, the drain covers all of a sidewall of the recessed portion.

Optionally in the embodiment of this disclosure, the at least one insulation layer includes an interlayer insulation layer, and the recessed portion penetrates through the interlayer insulation layer.

Optionally in the embodiment of this disclosure, the electroluminescence structure includes a first electrode;
the first electrode is on the bottom of the recessed portion near the base substrate; and
the first electrode and the active layer are in a same layer and are made of a same material.

Optionally in the embodiment of this disclosure, the at least one insulation layer includes an interlayer insulation layer and a buffer layer;
wherein the buffer layer is between the interlayer insulation and the base substrate, and the recessed portion penetrates through the interlayer insulation layer and the buffer layer.

Optionally in the embodiment of this disclosure, the array substrate further including:
a light-shielding layer between the buffer layer and the base substrate;
wherein an orthographic projection of the light-shielding layer on the base substrate overlaps with a part of or all of an orthographic projection of the active layer on the base substrate, and the light-shielding layer is configured to prevent light from being incident on the active layer;
wherein the electroluminescence structure includes a first electrode, the first electrode is on the bottom of the recessed portion near the base substrate, and the first electrode and the light-shielding layer are in a same layer and are made of a same material.

Optionally in the embodiment of this disclosure, the array substrate further including:
an organic layer between the base substrate and the at least one insulation layer, and a light-shielding structure between the organic layer and the base substrate;
wherein an orthographic projection of the light-shielding structure on the base substrate overlaps with a part of or all of an orthographic projection of the active layer on the base substrate, and the light-shielding structure is configured to prevent light from being incident on the active layer.

Optionally in the embodiment of this disclosure, the electroluminescence structure includes a first electrode configured to drive the pixel element; and one of the light-shielding structure and the active layer is at a same layer as the first electrode.

Optionally in the embodiment of this disclosure, the light-shielding structure includes: a filter structure between the thin film transistor and the base substrate, and a light-shielding layer between the filter structure and the thin film transistor; and
the first electrode and the light-shielding layer are at the same layer.

Optionally in the embodiment of this disclosure, the filter structure includes one or a combination of:
a first color filter on the base substrate;
a second color filter on one side of the first color filter away from the base substrate; or
a third color filter on one side of the second color filter away from the base substrate.

Optionally in the embodiment of this disclosure, on the condition that the first electrode and the active layer are at the same layer, the light-shielding structure includes one or a combination of:
a first color filter on the base substrate;
a second color filter on one side of the first color filter away from the base substrate; and
a third color filter on one side of the second color filter away from the base substrate.

Optionally in the embodiment of this disclosure, the array substrate further includes a first color filter or a second color filter or a third color filter between the electroluminescence structure and the base substrate.

Optionally in the embodiment of this disclosure, the electroluminescence structure further includes: a second electrode opposite to the first electrode, and a light-emitting layer between the first electrode and the second electrode.

Optionally in the embodiment of this disclosure, the thin film transistor further includes a source-drain layer on one side of the active layer away from the base substrate; the source-drain layer is higher than the light-emitting layer on a plane parallel to the base substrate.

Optionally in the embodiment of this disclosure, the array substrate further includes a layer structure between the second electrode and the source-drain layer, wherein the layer structure is a passivation layer and a pixel definition layer.

Correspondingly an embodiment of this disclosure further provides a display panel including the array substrate according to the embodiment of this disclosure.

Correspondingly an embodiment of this disclosure further provides a display device including the display panel according to the embodiment of this disclosure.

DETAILED DESCRIPTION OF THE EMBODIMENTS

Figure 1:
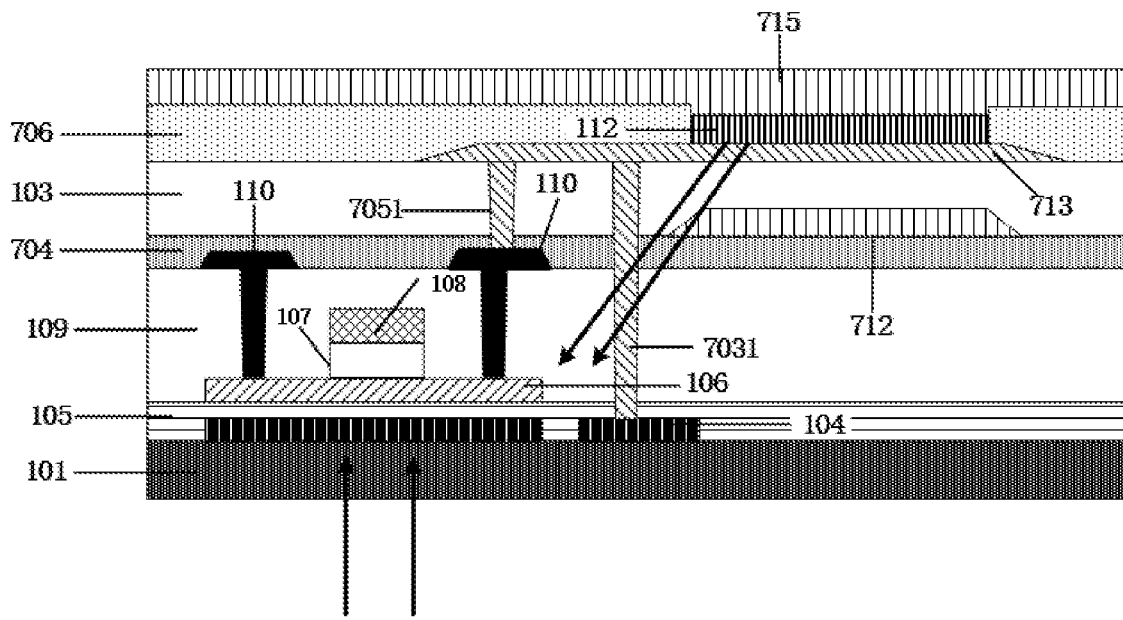
FIG. 1 is a schematic structural diagram of an array substrate in the related art.

In order to make the objects, technical solutions, and advantages of this disclosure more apparent, this disclosure will be described below in details with reference to the drawings. Apparently the embodiments to be described are only a part but all of the embodiments of this disclosure, and are only intended to illustrate and explain this disclosure, but not to limit this disclosure thereto. The embodiments of this disclosure, and the features in the embodiments can be combined with each other unless they conflict with each other. Based upon the embodiments here of this disclosure, all the other embodiments which can occur to those ordinarily skilled in the art without any inventive effort shall come into the scope of this disclosure as claimed.

It shall be noted that the shapes and sizes of respective components in the drawings shall not reflect any real proportion, but are only intended to illustrate this disclosure. Like or similar reference numerals will refer to like or similar elements, or elements with like or similar functions throughout the drawings.

As illustrated in FIG. 1, an array substrate can generally include: a base substrate 101, a buffer layer 105 on the base substrate 101, an interlayer insulation layer 109 on one side of the buffer layer 105 away from the base substrate 101, a passivation layer 704 on one side of the interlayer insulation layer 109 away from the base substrate 101, an organic layer 103 on one side of the passivation layer 704 away from the base substrate 101, a pixel definition layer 706 on one side of the organic layer 103 away from the base substrate 101, a light-shielding layer 104 between the buffer layer 105 and the base substrate 101, an active layer 106 on one side of the buffer layer 105 away from the base substrate 101, where a positive projection of the light-shielding layer 104 onto the base substrate 101 covers a positive projection of the active layer 106 onto the base substrate 101, a gate insulation layer 107 on one side of the active layer 106 away from the base substrate 101, a gate layer 108 on one side of the gate insulation layer 107 away from the base substrate 101, a source-drain layer 110 on one side of the gate layer 108 away from the base substrate 101, between the passivation layer 704 and the interlayer insulation layer 109, an anode layer 713 on one side of the organic layer 103 away from the base substrate 101, between the pixel definition layer 706 and the organic layer 103, a light-emitting layer 112 on one side of the anode layer 713 away from the base substrate 101, a cathode layer 715 on one side of the light-emitting layer 112 away from the base substrate 101, and a color filter 712 between the anode layer 713 and the passivation layer 704, where the color filter 712 can be a red filter or a green filter or a blue filter. The source-drain layer 110 is electrically connected with the active layer 106 through via holes running through the interlayer insulation layer 109. A signal line is further arranged at the source-drain layer 110, and is electrically connected with the light-shielding layer 104 through a via hole 7031 running through the interlayer insulation layer 109 and the buffer layer 105. The anode layer 713 is electrically connected with the signal line at the source-drain layer 110 through a via hole 7051 running through the organic layer 103 and the passivation layer 704.

The array substrate as illustrated in FIG. 1 shall be fabricated in a large number of, e.g., thirteen number of, mask processes, thus complicating the fabrication process flow and increasing the process cost. Since a thin film transistor on the array substrate is easily illuminated by light sources at the bottom and the top, the thin film transistor has low stability for illumination, where the light source at the bottom of a backboard includes ambient light, and reflected light from inside the array substrate, and the light source at the top includes light emitted from the light-emitting layer in the array substrate. It is difficult to optimize the performance of the array substrate due to the low stability for illumination.

In view of this, the embodiments of this disclosure provide an array substrate, a method for fabricating the same, a display panel, and a display device so as to reduce the number of mask processes required for fabricating the array substrate, and to simplify the method for fabricating the array substrate. Furthermore the thickness of the display panel can be reduced, and light emitted from a light-emitting layer can be alleviated or avoided from being incident on a thin film transistor in the array substrate, to thereby improve the stability of the thin film transistor for illumination, and optimize the performance of the display panel.

Figure 2:
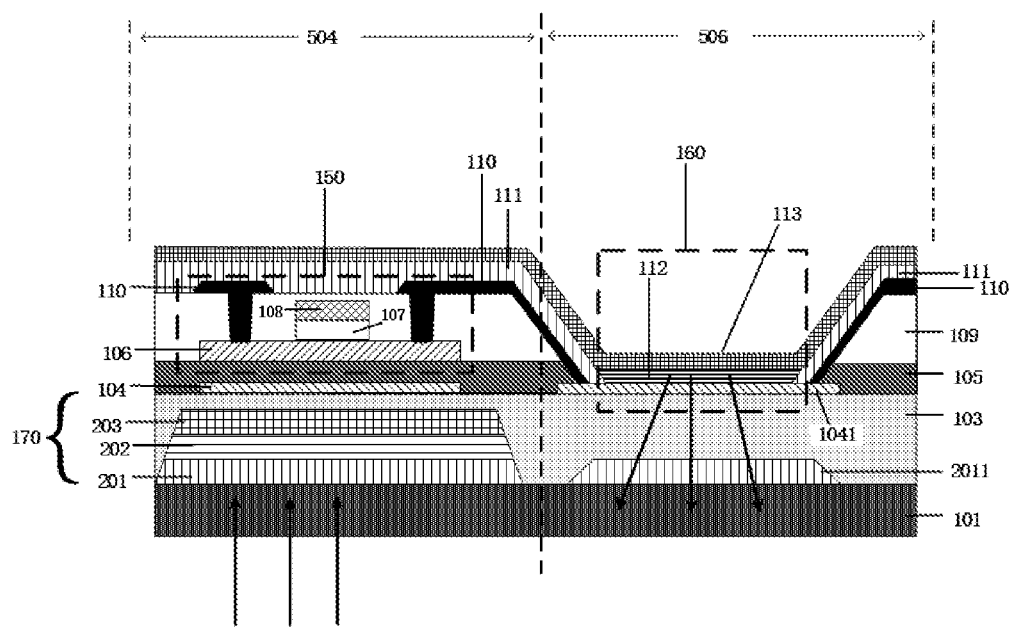
FIG. 2 is a first schematic structural diagram of an array substrate according to an embodiment of this disclosure.
Figure 3:
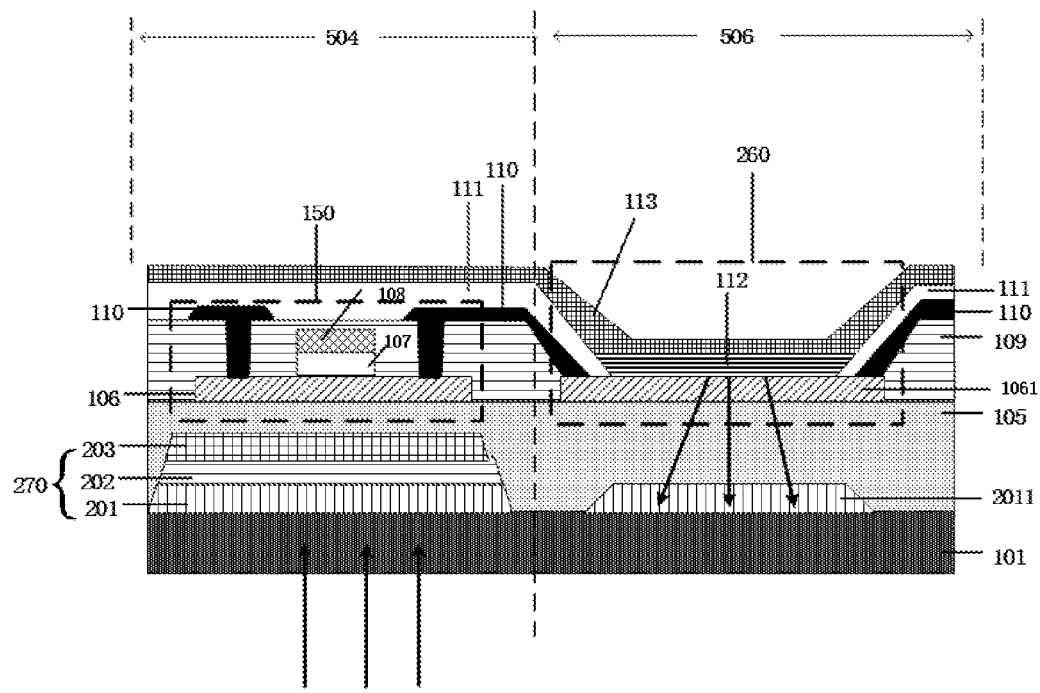
FIG. 3 is a second schematic structural diagram of an array substrate according to an embodiment of this disclosure.

As illustrated in FIG. 2 and FIG. 3, an array substrate according to an embodiment of this disclosure includes: a base substrate 101, and at least one pixel elements on one side of the base substrate 101, each of the at least one of pixel element includes: a Thin Film Transistor (TFT) 150 and an electroluminescence structure 160; the thin film transistor 150 includes a drain and an active layer 106; at least one insulation layer on one side of the base substrate 101 near the at least one of pixel element; wherein a surface of the at least one insulation away from the base substrate 101 includes a recessed portion, and the electroluminescence structure 160 is in the recessed portion; each of the at least one of pixel element includes a light-emitting area 506, and a circuit area 504 adjacent to the light-emitting area 506; wherein the thin film transistor 150 is in the circuit area 504, and the electroluminescence structure 160 is in the light-emitting area 506; the active layer 106 is between the base substrate 101 and the at least one insulation layer; the drain is on one side of the at least one insulation layer away from the base substrate 101, and the drain covers at least a portion of a sidewall of the recessed portion for preventing light emitted by the electroluminescence structure 160 from being incident on the active layer 106.

In some possible implementation, the drain covers all of a sidewall of the recessed portion.

In some possible implementation, the at least one insulation layer includes an interlayer insulation layer 109, and the recessed portion penetrates through the interlayer insulation layer 109.

In some possible implementation, the electroluminescence structure 160 includes a first electrode (1041 in FIG. 2, or 1061 in FIG. 3); the first electrode is on the bottom of the recessed portion near the base substrate 101; and the first electrode and the active layer 106 are in a same layer and are made of a same material.

In some possible implementation, the at least one insulation layer includes an interlayer insulation layer 109 and a buffer layer 105; wherein the buffer layer 105 is between the interlayer insulation and the base substrate 101, and the recessed portion penetrates through the interlayer insulation layer 109 and the buffer layer 105.

In some possible implementation, the array substrate further including: a light-shielding layer 104 between the buffer layer 105 and the base substrate 101; wherein an orthographic projection of the light-shielding layer 104 on the base substrate 101 overlaps with a part of or all of an orthographic projection of the active layer 106 on the base substrate 101, and the light-shielding layer 104 is configured to prevent light from being incident on the active layer 106; wherein the electroluminescence structure 160 includes a first electrode, the first electrode is on the bottom of the recessed portion near the base substrate 101, and the first electrode and the light-shielding layer 104 are in a same layer and are made of a same material.

In some possible implementation, the array substrate further including: an organic layer 103 between the base substrate 101 and the at least one insulation layer, and a light-shielding structure 170 between the organic layer 103 and the base substrate 101; wherein an orthographic projection of the light-shielding structure 170 on the base substrate 101 overlaps with a part of or all of an orthographic projection of the active layer 106 on the base substrate 101, and the light-shielding structure 170 is configured to prevent light from being incident on the active layer 106.

In some possible implementation, the electroluminescence structure 160 includes a first electrode configured to drive the pixel element; and one of the light-shielding structure 170 and the active layer 106 is formed at a same layer as the first electrode.\

In some possible implementation, the electroluminescence structure 160 includes the first electrode configured to drive the pixel element.

In the array substrate according to the embodiment of this disclosure, one of the light-shielding structure and the active layer is formed at a same layer as the first electrode using a same mask. the first electrode and the light-shielding structure are formed using the same mask, or the first electrode, and the active layer in the thin film transistor are formed using the same mask, so that they can be formed at the same time to thereby reduce the number of mask processes required for fabricating the array substrate, so as to simplify a method for fabricating the array substrate. Furthermore the thickness of a display panel can be reduced, and the position, of the light-emitting layer, on the first electrode, in the electroluminescence structure, relative to the base substrate can be lowered to thereby alleviate or avoid light emitted from the light-emitting layer from being incident on the thin film transistor in the array substrate to thereby improve the stability of the thin film transistor for illumination, and optimize the performance of the display panel.

In a particular implementation, in the array substrate according to the embodiment of this disclosure, the first electrode can be an anode, for example, and a second electrode can be a cathode, for example.

In a particular implementation, in the embodiment of this disclosure, as illustrated in FIG. 2 and FIG. 3, the electroluminescence structure 160 can further include: a second electrode 113 opposite to the first electrode (1041 in FIG. 2, and 1061 in FIG. 3), and a light-emitting layer 112 between the first electrode and the second electrode 113. Furthermore the thin film transistor 150 can further include: a gate insulation layer 107 on the active layer 106 away from the base substrate 101, a gate layer 108 on one side of the gate insulation layer 107 away from the base substrate 101, a source-drain layer 110 on one side of the gate layer 108 away from the base substrate 101, a the interlayer insulation layer 109 between the source-drain layer 110 and the active layer 106, where the source-drain layer 110 includes a source and a drain, the source and the drain are electrically connected with the active layer 106 through the via holes running through the interlayer insulation layer 109, and the drain is electrically connected with the first electrode.

This disclosure will be described below in details with reference to a particular embodiment thereof. It shall be noted that this embodiment is intended to better set forth this disclosure, but not to limit this disclosure thereto.

In some possible implementation, in a particular implementation, in the embodiment of this disclosure, the first electrode and the light-shielding structure can be formed at the same layer using the same mask. Furthermore, as illustrated in FIG. 2, the light-shielding structure 170 can include: a filter structure between the thin film transistor 150 and the base substrate 101, and a light-shielding layer 104 between the filter structure and the thin film transistor 150, where the first electrode 1041, and the light-shielding layer 104 in the light-shielding structure 170 are formed at the same layer using the same mask, and can also be made of the same material. In this way, the first electrode 1041 formed at the same layer as the light-shielding layer 104 using the same mask can be an anode in the electroluminescence structure 160 to thereby dispense with a mask process for forming an anode layer separately, so as to reduce the number of mask processes required for fabricating the array substrate, thus simplifying the method for fabricating the array substrate, and reducing the thickness of the display panel. Furthermore while the display panel is being lightened in operation, the TFT 150 may be illuminated, and thus adversely affected, by natural light incident from the bottom of the base substrate 101 (the natural light incident from the bottom is represented by black arrows pointing to the TFT 150 through the base substrate 101 from the bottom as illustrated in FIG. 2), so the light-shielding layer 104 can be between the TFT 150 and the base substrate 101 to protect the TFT 150 from being illuminated by the light from the bottom, so as to improve the stability of the TFT 150 for illumination, and to optimize the performance of the display panel.

Indium Tin Oxide (ITO) generally strongly absorbs light ranging from ultraviolet to blue light, and in a particular implementation, the light-shielding layer 104 and the first electrode 1041 in FIG. 2 can be made of Indium Tin Oxide (ITO), for example. In this way, the light-shielding layer is made of ITO to thereby alleviate or avoid light ranging from ultraviolet to blue light from being incident on the TFT 105, so as to protect the TFT 105 from being illuminated. Furthermore the first electrode can be the first electrode of the electroluminescence structure 160 to thereby reduce the number of mask processes required for fabricating the array substrate.

Figure 4:
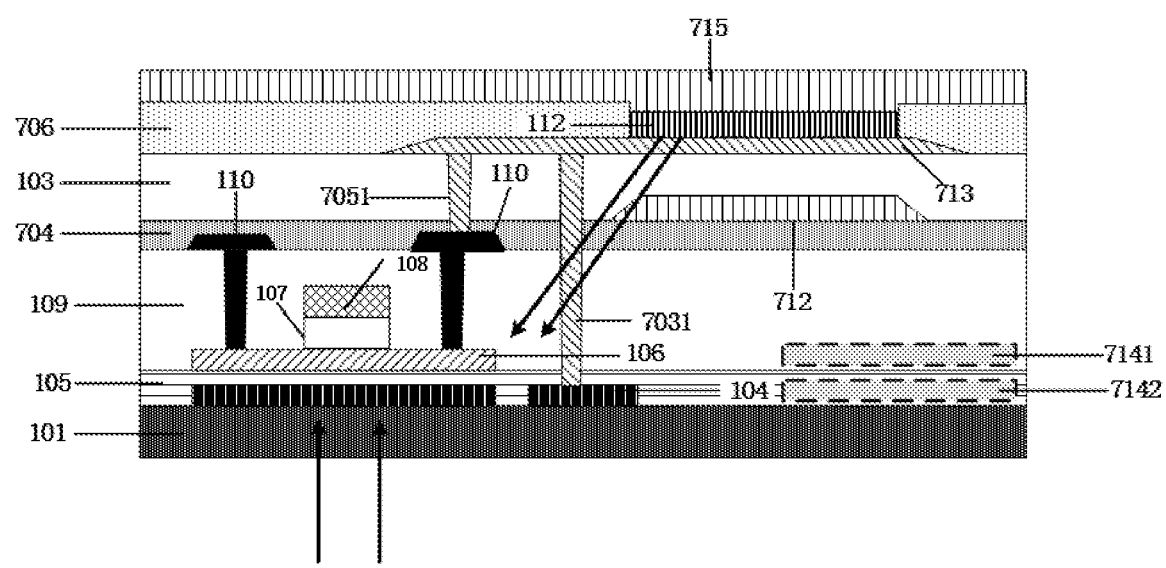
FIG. 4 is a schematic diagram of comparing light-emission positions in the array substrate according to an embodiment of this discourse with the related art.

In a particular implementation, in the array substrate above according to the embodiment of this disclosure, as illustrated in FIG. 2 and FIG. 4, the original light-emitting layer 112 is lowered to the position 7142 as compared with the structure as illustrated in FIG. 1 so that the position of the light-emitting layer in the electroluminescence structure 160 relative to the base substrate 101 can be lowered to thereby have the light-emitting layer and the light-shielding layer positioned at almost the same height relative to the base substrate, so as to alleviate or avoid the light emitting from the light-emitting layer from being incident on the thin film transistor in the array substrate, thus improving the stability of the TFT 150 for illumination, and optimizing the performance of the display panel. In FIG. 2, 504 refers to a TFT circuit area including the TFT 150, and 506 refers to a light-emitting area including the electroluminescence structure 160. The other reference numerals in FIG. 4 are the same as those in the structure as illustrated in FIG. 1.

In a particular implementation, in the embodiment of this disclosure, as illustrated in FIG. 2, the filter structure can include: a first color filter 201, and/or a second color filter 202 above the first color filter 201, and/or a third color filter 203 above the second color filter 202, on one same side of the base substrate 101, that is, the filter structure can include one or any combination of the first color filter 201, the second color filter 202, or the third color filter 203. In this way, at least one filter layer can be between the light-shielding layer 104 and the base substrate 101 to thereby further protect the TFT 150 from being illuminated by the light from the bottom, so as to further improve the stability of the TFT 150 for illumination, and to optimize the performance of the display panel. Also the filter structure can absorb ultraviolet rays among the natural light to thereby alleviate or avoid the ultraviolet rays from being incident on the TFT 150. Particularly the filter structure can include only the first color filter 201 or the second color filter 202 or the third color filter 203, or as illustrated in FIG. 2, the filter structure can include the first color filter 201, the second color filter 202, and the third color filter 203. FIG. 2 only illustrates an optional implementation of the structure of the array substrate according to the embodiment of this disclosure, although the embodiment of this disclosure will not be limited thereto.

In a particular implementation, the array substrate as illustrated in FIG. 2 can further include: an organic layer 103 between the light-shielding layer 104 and the filter structure, and a buffer layer 105 between the light-shielding layer 104 and the active layer 106, where the positive projection of the light-shielding layer 104 onto the base substrate 101 covers the positive projection of the active layer 106 onto the base substrate 101. Furthermore in order to avoid the light-shielding layer from hindering an image from being displayed, the positive projection of the light-shielding layer 104 onto the base substrate 101 can overlap with the positive projection of the active layer 106 onto the base substrate 101.

Furthermore in order to display an image in color, as illustrated in FIG. 2, the array substrate can further include a filter 2011, for filtering light, between the electroluminescence structure 160 and the base substrate 101. Furthermore, the filter 2011 can be between the base substrate 101 and the active layer 103. Furthermore one of the first color filter 201, the second color filter 202, and the third color filter 203 can be formed at the same layer as the filter 2011 using the same mask, and can also be made of the same material as the filter 2011, so that the filter 2011 can be the first color filter 201 or the second color filter 202 or the third color filter 203 to filter light, particularly according to the color required of the corresponding light-emitting layer 112.

In a particular implementation, the first color filter 201, the second color filter 202, and the third color filter 203 can be a red filter, a green filter, and a blue filter respectively. In a real application, the positional relationship in the vertical direction between the first color filter 201, the second color filter 202, and the third color filter 203 can be defined as needed, and any one or two or three of the first color filter 201, the second color filter 202, and the third color filter 203 can be above the base substrate 101 as a light-shielding structure. Here the light-shielding structure is used for shielding the light incident from the bottom of the array substrate from being incident on the TFT 150, and is not used for filtering light. Neither the positional relationship in the vertical direction between the three color filters, nor the number of color filters to be arranged in the light-shielding structure will affect the performance of the light-shielding structure, but the positional relationship in the vertical direction between the three color filters, and the number of color filters to be arranged in the light-shielding structure can be defined as needed, although the embodiment of this disclosure will not be limited thereto.

Figure 5:
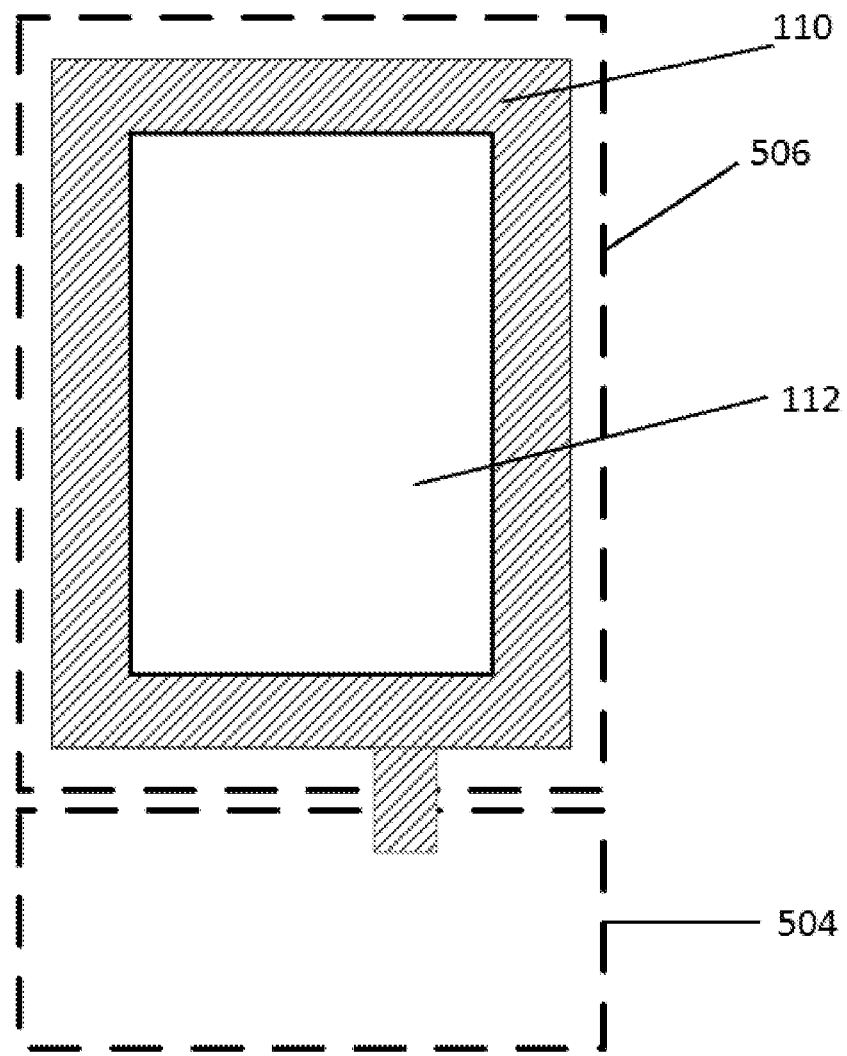
FIG. 5 is a schematic structural diagram of the array substrate according to the embodiment of this discourse in a top view.

In a particular implementation, in the embodiment of this disclosure, as illustrated in FIG. 2 and FIG. 5, the array substrate can further include a surrounding layer on one side of the active layer 106 away from the base substrate 101, where the surrounding layer is arranged annularly around the light-emitting layer 112 as an all-surrounding structure. In this way, the all-surrounding structure can be formed around the light-emitting layer to thereby block the light emitted from the light-emitting layer and reflect the light emitted from the light-emitting layer back into the electroluminescence structure so as to avoid the light emitted from the light-emitting layer from being incident on the thin film transistor from a side thereof, while improving the light exit ratio of the electroluminescence structure.

In a particular implementation, in the embodiment of this disclosure, as illustrated in FIG. 2 and FIG. 5, the surrounding layer can be formed at the same layer as the source-drain layer 110 using the same mask. In this way, the all-surrounding structure can be formed around the light-emitting layer in the electroluminescence structure on the array substrate using the source-drain layer in the thin film transistor on the array substrate, so that the source-drain layer and the surrounding layer can be formed at the same time to thereby simplify the flow of the fabrication process. Furthermore the surrounding layer is electrically connected with the drain at the source-drain layer 110 so that the first electrode is electrically connected with the surrounding layer.

Furthermore in a particular implementation, in the array substrate above according to the embodiment of this disclosure, as illustrated in FIG. 2, the source-drain layer 110 can be higher than the light-emitting layer 112 on a plane parallel to the base substrate 101. In this way, the all-surrounding layer formed around the light-emitting layer 112 as the all-surrounding structure can block the light emitted from the light-emitting layer 112 and also reflect the light emitted from the light-emitting layer 112 back into the electroluminescence structure to thereby improve the light exit ratio of the electroluminescence structure, and protect the TFT 150 from being illuminated by the light.

Furthermore in a particular implementation, as illustrated in FIG. 2, the array substrate can further include a layer structure 111 between the second electrode 113 and the source-drain layer 110, where the layer structure 111 can be the passivation layer and the pixel definition layer. Particularly the layer structure 111 can be made of silicon oxide, for example, to thereby protect the passivation layer of the TFT 150. Furthermore the layer structure 111 can be between the second electrode 113 and the source-drain layer 110, and thus can also be the pixel definition layer; and as compared with the prior art, the passivation layer and the pixel definition layer which would otherwise have been formed in two mask processes in the prior art can be formed at one layer in one mask process to thereby further reduce the number of mask processes required for fabricating the array substrate, so as to simplify the method for fabricating the array substrate, and to reduce the thickness of the display panel.

Furthermore in a particular implementation, in the array substrate above according to the embodiment of this disclosure, the layer structure 111 can be made of silicon oxide, for example, which is a hydrophobic material to thereby facilitate the uniform of the light-emitting layer inkjet-printed on the layer structure 111. Of course, the material of the layer structure 111 will not be limited to silicon oxide, but can be particularly designed as needed in reality, although the embodiment of this disclosure will not be limited thereto.

Furthermore in a particular implementation, in the array substrate above according to the embodiment of this disclosure, the active layer 106 can be made of Indium Gallium Zinc Oxide (IGZO), for example.

Furthermore in a particular implementation, in the array substrate above according to the embodiment of this disclosure, the buffer layer 105 can be made of an organic material, for example, which can include a highly waterproof and oxygen-resistive organic material. In this way, the buffer layer 105 can be made of the highly waterproof and/or oxygen-resistive organic material to thereby prevent water and oxygen from adversely affecting the active layer 106 through the buffer layer, so as to prevent water and oxygen from adversely affecting the TFT 150.

In some other possible implementation, in a particular implementation, as illustrated in FIG. 3, the first electrode 1061 can be formed at the same layer as the active layer 106 using the same mask, and can also be made of the same material as the active layer 106. In this way, the first electrode 1061 formed at the same layer as the active layer 106 using the same mask can be the anode in the electroluminescence structure 260 to thereby dispense with a mask process for forming the anode layer separately, and reduce the number of mask processes required for fabricating the array substrate so as to simplify the method for fabricating the array substrate, and to reduce the thickness of the display panel. Furthermore it shall be noted that FIG. 3 illustrates a schematic structural diagram of the array substrate according to this embodiment, which is derived by modifying a part of the structure of the array substrate as illustrated in FIG. 2. Only the differences of the array substrate as illustrated in FIG. 3 from the array substrate as illustrated in FIG. 2 will be described below, and a repeated description of their commonalities will be repeated here.

In a particular implementation, in the array substrate above according to the embodiment of this disclosure, as illustrated in FIG. 3 and FIG. 4, as compared with the structure as illustrated in FIG. 1, the original light-emitting layer 112 is lowered to the position 7141 to thereby lower the position of the light-emitting layer in the electroluminescence structure 260 relative to the base substrate 101 so as to have the light-emitting layer and the active layer 106 positioned at almost the same height relative to the base substrate 101, thus alleviating or avoiding the light emitting from the light-emitting layer 112 from being incident on the thin film transistor 150 in the array substrate, and consequently improving the stability of the TFT 150 for illumination, and optimizing the performance of the display panel. In FIG. 3, 504 refers to a TFT circuit area including the TFT 150, and 506 refers to a light-emitting area including the electroluminescence structure 260. The other reference numerals in FIG. 4 are the same as those in the structure as illustrated in FIG. 1.

In a particular implementation, in the embodiment of this disclosure, as illustrated in FIG. 3, the array substrate can further include the buffer 105 between the active layer 106 and the base substrate 101. The light-shielding structure 207 is between the buffer layer 105 and the base substrate 101. Furthermore the light-shielding structure 207 can include a first color filter 201, and/or a second color filter 202 above the first color filter 201, and/or a third color filter 203 above the second color filter 202, on one same side of the base substrate 101, that is, the light-shielding structure 270 can include one or any combination of the first color filter 201, the second color filter 202, or the third color filter 203. In this way, at least one filter layer can be between the thin film transistor 150 and the base substrate 101 to thereby further protect the TFT 150 from being illuminated by the light from the bottom, so as to improve the stability of the TFT 150 for illumination, and to optimize the performance of the display panel. Particularly the light-shielding structure 270 can include only the first color filter 201 or the second color filter 202 or the third color filter 203, or as illustrated in FIG. 3, the light-shielding structure 270 can include the first color filter 201, the second color filter 202, and the third color filter 203. FIG. 3 only illustrates an optional implementation of the structure of the array substrate according to the embodiment of this disclosure, although the embodiment of this disclosure will not be limited thereto.

While the display panel is being operating, the TFT 150 may be illuminated, and thus adversely affected, by natural light incident from the bottom of the base substrate 101 (the natural light incident from the bottom is represented by black arrows pointing to the TFT 150 through the base substrate 101 from the bottom as illustrated in FIG. 3), so the light-shielding structure 270 can be between the TFT 150 and the base substrate 101 to protect the TFT 150 from being illuminated by the light from the bottom, so as to improve the stability of the TFT 150 for illumination, and to optimize the performance of the display panel. Furthermore the light-shielding structure 270 can also absorb ultraviolet rays among the natural light to thereby alleviate or avoid the ultraviolet rays from being incident on the TFT 150.

In a particular implementation, as illustrated in FIG. 3, the array substrate can further include a filter 2011, for filtering light, between the electroluminescence structure 260 and the base substrate 101. Furthermore, the filter 2011 can be between the base substrate 101 and the buffer layer 105. Furthermore one of the first color filter 201, the second color filter 202, and the third color filter 203 can be formed at the same layer as the filter 2011 using the same mask, and can also be made of the same material as the filter 2011, so that the filter 2011 can be the first color filter 201 or the second color filter 202 or the third color filter 203 to filter light, particularly according to the color required of the corresponding light-emitting layer 112. The first color filter 201 or the second color filter 202 or the third color filter 203 can be arranged at the same layer as the filter 2011 as a light-shielding layer to thereby dispense with a mask process for further forming the light-shielding layer separately above the layer including the filter 2011, and reduce the number of mask processes required for fabricating the array substrate.

It shall be noted that the first color filter 201, the second color filter 202, and the third color filter 203 can be a red filter, a green filter, and a blue filter respectively. Particularly the positional relationship in the vertical direction between the first color filter 201, the second color filter 202, and the third color filter 203 can be defined as needed, and any one or two or three of the first color filter 201, the second color filter 202, and the third color filter 203 can be above the base substrate 101 as a light-shielding layer. Here the first color filter 201 and/or the second color filter 202 and/or the third color filter 203 as a light-shielding structure is used for shielding the light incident from the bottom of the array substrate from being incident on the TFT 150, and not used for filtering light. Neither the positional relationship in the vertical direction between the three color filters, nor the number of color filters to be arranged in the light-shielding structure will affect the performance of the light-shielding structure, but the positional relationship in the vertical direction between the three color filters, and the number of color filters to be arranged in the light-shielding structure can be defined as needed, although the embodiment of this disclosure will not be limited thereto.

In a particular implementation, in the embodiment of this disclosure, as illustrated in FIG. 3 and FIG. 5, the array substrate can further include a surrounding layer on one side of the active layer 106 away from the base substrate 101, where the surrounding layer is arranged annularly around the light-emitting layer 112 as an all-surrounding structure. In this way, the all-surrounding structure can be formed around the light-emitting layer to thereby block the light emitted from the light-emitting layer and reflect the light emitted from the light-emitting layer back into the electroluminescence structure so as to avoid the light emitted from the light-emitting layer from being incident on the thin film transistor from a side thereof, while improving the light exit ratio of the electroluminescence structure.

In a particular implementation, in the embodiment of this disclosure, as illustrated in FIG. 3 and FIG. 5, the surrounding layer can be formed at the same layer as the source-drain layer 110 using the same mask. In this way, the all-surrounding structure can be formed around the light-emitting layer in the electroluminescence structure on the array substrate using the source-drain layer in the thin film transistor on the array substrate, so that the source-drain layer and the surrounding layer can be formed at the same time to thereby simplify the flow of the fabrication process. Furthermore the surrounding layer is electrically connected with the drain at the source-drain layer 110.

Furthermore in a particular implementation, in the array substrate above according to the embodiment of this disclosure, as illustrated in FIG. 3, the source-drain layer 110 can be higher than the light-emitting layer 112 on a plane parallel to the base substrate 101. In this way, the all-surrounding layer formed around the light-emitting layer 112 as the all-surrounding structure can block the light emitted from the light-emitting layer 112 and also reflect the light emitted from the light-emitting layer 112 back into the electroluminescence structure to thereby improve the light exit ratio of the electroluminescence structure, and protect the TFT 150 from being illuminated by the light.

Furthermore in a particular implementation, as illustrated in FIG. 2, the array substrate can further include a layer structure 111 between the second electrode 113 and the source-drain layer 110, where the layer structure 111 can be the passivation layer and the pixel definition layer. Particularly the layer structure 111 can be made of silicon oxide, for example, to thereby protect the passivation layer of the TFT 150. Furthermore the layer structure 111 can be between the second electrode 113 and the source-drain layer 110, and thus can also be the pixel definition layer; and as compared with the prior art, the passivation layer and the pixel definition layer which would otherwise have been formed in two mask processes in the prior art can be formed at one layer in one mask process to thereby further reduce the number of mask processes required for fabricating the array substrate, so as to simplify the method for fabricating the array substrate, and to reduce the thickness of the display panel.

Based upon the same inventive idea, an embodiment of this disclosure further provides a display panel including the array substrate above according to the embodiment of this disclosure. The display panel can be an Organic Light-Emitting Diode (OLED) panel, an Active-Matrix Organic Light-Emitting Diode (AMOLED) panel, or another display panel to which the technical solution according to the embodiment of this disclosure can be applicable. All the other indispensable components to the display panel shall readily occur to those ordinarily skilled in the art, so a repeated description thereof will be omitted here, and the embodiment of this disclosure will not be limited thereto. Reference can be made to the embodiment of the array substrate above for an implementation of the display panel, so a repeated description thereof will be omitted here.

Based upon the same inventive idea, an embodiment of this disclosure further provides a display device including the display panel above according to the embodiment of this disclosure. The display device can be a mobile phone, a tablet computer, a TV set, a monitor, a notebook computer, a digital photo frame, a navigator, or any other product or component with a display function. All the other indispensable components to the display device shall readily occur to those ordinarily skilled in the art, so a repeated description thereof will be omitted here, and the embodiment of this disclosure will not be limited thereto. Reference can be made to the embodiment of the array substrate above for an implementation of the display device, so a repeated description thereof will be omitted here.

Figure 6:
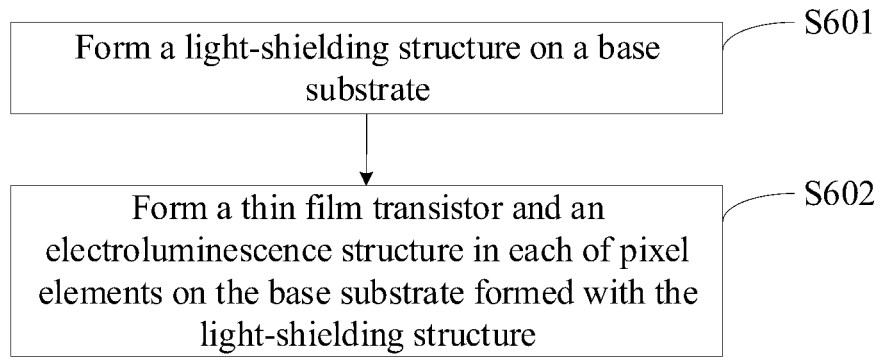
FIG. 6 is a first flow chart of a method for fabricating an array substrate according to an embodiment of this disclosure.

Based upon the same inventive idea, an embodiment of this disclosure further provides a method for fabricating an array substrate, and as illustrated in FIG. 6, the method can include the following steps.

Step 601, forming a light-shielding structure on a base substrate.

Step 602, forming a thin film transistor and an electroluminescence structure in each of pixel elements on the base substrate formed with the light-shielding structure, where forming the thin film transistor includes: forming a pattern of an active layer on one side of the light-shielding structure away from the base substrate, and forming the electroluminescence structure includes: forming a first electrode for driving the pixel element. Furthermore one of the light-shielding structure and the active layer is formed at a same layer as the first electrode using a same mask.

Figure 7:
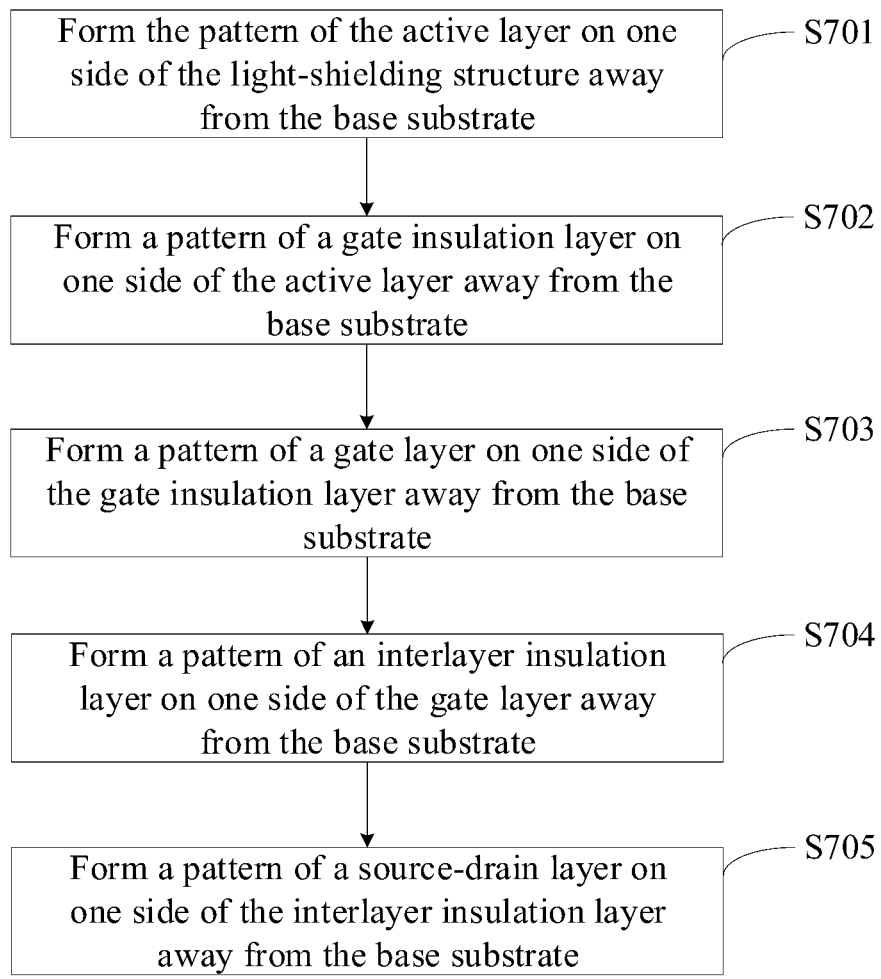
FIG. 7 is a second flow chart of the method for fabricating an array substrate according to an embodiment of this disclosure.

In a particular implementation, as illustrated in FIG. 7, forming the thin film transistor can include the following steps.

Step S701, forming the pattern of the active layer on one side of the light-shielding structure away from the base substrate.

Step S702, forming a pattern of a gate insulation layer on one side of the active layer away from the base substrate.

Step S703, forming a pattern of a gate layer on one side of the gate insulation layer away from the base substrate.

Step S704, forming a pattern of an interlayer insulation layer on one side of the gate layer away from the base substrate, where the interlayer insulation layer includes via holes running there through.

Step S705, forming a pattern of a source-drain layer on one side of the interlayer insulation layer away from the base substrate.

Figure 8:
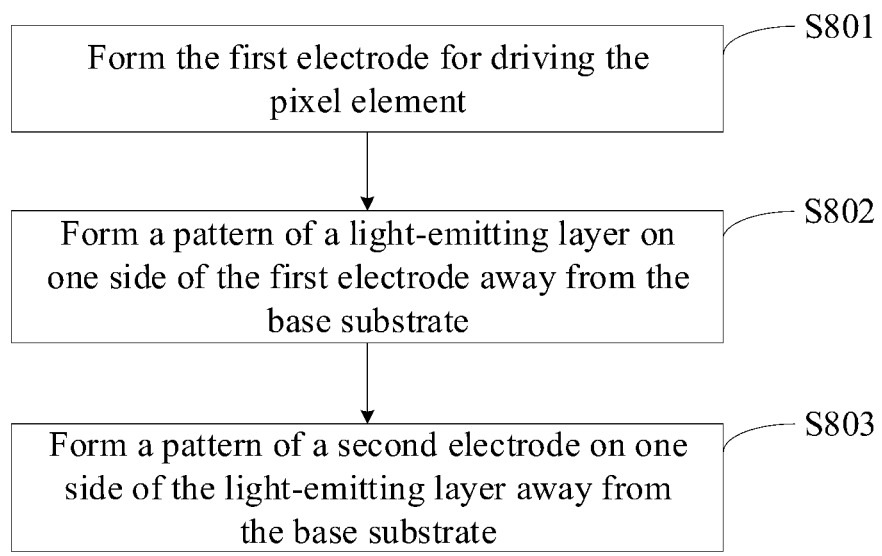
FIG. 8 is a third flow chart of the method for fabricating an array substrate according to an embodiment of this disclosure.

In a particular implementation, as illustrated in FIG. 8, forming the electroluminescence structure can include the following steps.

Step S801, forming the first electrode for driving the pixel element.

Step S802, forming a pattern of a light-emitting layer on one side of the first electrode away from the base substrate.

Step S803, forming a pattern of a second electrode on one side of the light-emitting layer away from the base substrate.

In a particular implementation, in the embodiment of this disclosure, when the first electrode and the light-shielding structure are formed at the same layer using the same mask, forming the light-shielding structure can include: forming a filter structure on the base substrate; and forming a light-shielding layer on one side of the filter structure away from the base substrate while performing the step S801. In this way, the light-shielding layer and the first electrode can be formed at the same time.

In a particular implementation, forming the filter structure includes one or a combination of the following steps: forming a first color filter on the base substrate; forming a second color filter on one side of the first color filter away from the base substrate; and forming a third color filter on one side of the second color filter away from the base substrate.

In a particular implementation, in the embodiment of this disclosure, when the first electrode and the active layer are formed at the same layer using the same mask, the step 801 is performed while performing the step S701, so that the active layer and the first electrode can be formed at the same time. In this way, the first electrode is doped with ions while performing at least one of the steps S702, S703, S704, and S705 so that the doped first electrode is electrically conductive, where the first electrode can be doped with ions through plasma treatment.

In a particular implementation, in the embodiment of this disclosure, when the first electrode and the active layer are formed at the same layer using the same mask, forming the light-shielding structure includes one or a combination of the following steps: forming a first color filter on the base substrate; forming a second color filter on one side of the first color filter away from the base substrate; and forming a third color filter on one side of the second color filter away from the base substrate.

In a particular implementation, in the embodiment of this disclosure, after the pattern of the active layer is formed, the method can further include forming a pattern of a surrounding layer, where the surrounding layer is arranged annularly around the pattern of the light-emitting layer as an all-surrounding pattern. Furthermore the surrounding layer can be formed at the same layer as the source and the drain using the same mask.

Furthermore in a particular implementation, in the method above for fabricating an array substrate according to the embodiment of this disclosure, the source-drain layer is higher than the light-emitting layer on a plane parallel to the base substrate.

Furthermore in a particular implementation, in the method above for fabricating an array substrate according to the embodiment of this disclosure, the material formed the light-shielding layer includes indium tin oxide.

Furthermore in a particular implementation, in the method above for fabricating an array substrate according to the embodiment of this disclosure, the method further includes: forming the first color filter, the second color filter, and the third color filter under the base substrate.

Furthermore in a particular implementation, in the method above for fabricating an array substrate according to the embodiment of this disclosure, the surrounding layer is electrically connected with the first electrode.

Furthermore in a particular implementation, after the pattern of the first electrode is formed, and before the pattern of the light-emitting layer is formed, the method can further include forming a pattern of a layer structure, where the layer structure is a passivation layer and a pixel definition layer. Particularly in a particular implementation, after the surrounding layer is formed, and before the light-emitting layer is formed, the method can further include: forming the pattern of the layer structure.

Furthermore in a particular implementation, in the method above for fabricating an array substrate according to the embodiment of this disclosure, the material formed the layer structure includes silicon oxide.

Furthermore in a particular implementation, in the method above for fabricating an array substrate according to the embodiment of this disclosure, forming the layer structure includes plasma-treating the layer structure.

Furthermore in a particular implementation, in the method above for fabricating an array substrate according to the embodiment of this disclosure, the material formed the active layer includes indium gallium zinc oxide.

Furthermore in a particular implementation, in the method above for fabricating an array substrate according to the embodiment of this disclosure, the method further includes forming a buffer layer between the light-shielding layer and the active layer, where the material formed the buffer layer includes an organic material.

In the prior art, as illustrated in FIG. 1, the array substrate shall be fabricated (from the base substrate 101 to the pixel definition layer 706) using thirteen number of mask processes (i.e., patterning the respective layers), particularly as depicted in Table 1.

TABLE 1

| Mask process | Process flow of fabricating the array substrate as illustrated in FIG. 1 |
|---|---|
| 1 | Light-shielding layer 104 |
| 2 | Active layer 106 |
| 3 | Gate insulation layer 107 and gate layer 108 |
| 4 | Buffer layer 105 and interlayer insulation layer 109 |
| 5 | Contact hole CNT 7031 |
| 6 | Source-drain layer 110 |
| 7 | Color filter 712 corresponding to red light-emitting area |
| 8 | Color filter 712 corresponding to green light-emitting area |
| 9 | Color filter 712 corresponding to blue light-emitting area |
| 10 | Passivation layer 704 |
| 11 | Via hole 7051 at organic layer 103 |
| 12 | Anode layer 713 |
| 13 | Pixel definition layer 706 |

In the array substrate above according to the embodiment of this disclosure, the first electrode and the light-shielding structure, or the first electrode, and the active layer in the thin film transistor can be formed using the same mask to thereby reduce the number of mask processes required for fabricating the array substrate, so as to simplify the method for fabricating the array substrate, and to reduce the thickness of the display panel. An example thereof will be described below in details.

Figure 9:
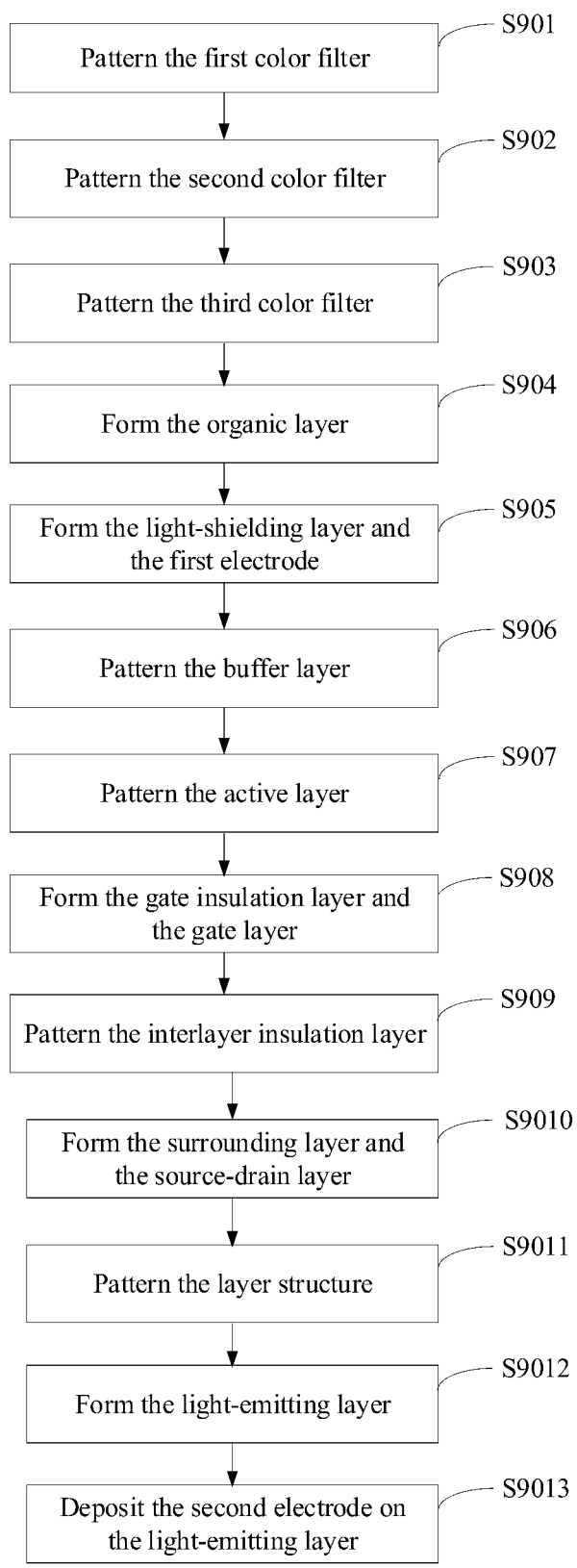
FIG. 9 is a fourth flow chart of the method for fabricating an array substrate according to an embodiment of this disclosure.

As illustrated in FIG. 9, a method for fabricating the array substrate as illustrated in FIG. 2 can include the following steps.

Step S901, patterning the first color filter 201 on the base substrate 101 in a patterning process (i.e., a mask process) to form a pattern of the first color filter 201.

Step S902, patterning the second color filter 202 in a patterning process to form a pattern of the second color filter 202 on one side of the first color filter 201 away from the base substrate 101.

Step S903, patterning the third color filter 203 in a patterning process to form a pattern of the third color filter 203 on one side of the second color filter 202 away from the base substrate 101.

Step S904, forming the organic layer 103 on the base substrate 101 after the steps S901 to S903 to planarize the array substrate.

Step S905, depositing a film on the organic layer 103 through sputtering or Physical Vapor Deposition (PVD), and patterning the film to form the light-shielding layer 104 and the first electrode 1041, where the light-shielding layer 104 and the first electrode 1041 can be made of ITO. In this way, a mask process for forming the first electrode 1041 separately can be dispensed with, and the thickness of the light-shielding layer 104 can range from 50 nanometers to 400 nanometers, and for example, can be 132 nanometers.

Step S906, forming the buffer layer 105 through Plasma Enhanced Chemical Vapor Deposition (PECVD), and patterning the buffer layer 105, where the thickness of the buffer layer 105 can range from 100 nanometers to 500 nanometers, and for example, can be 300 nanometers.

Step S907, depositing the active layer 106 through sputtering, and patterning the active layer 106, where the active layer 106 can be IGZO, for example, and the thickness of the active layer 106 can range from 10 nanometers to 100 nanometers, and for example, can be 40 nanometers.

Step S908, forming the gate insulation layer 107 through PECVD, where the gate insulation layer 107 can be made of silicon oxide, for example, and the thickness thereof can range from 100 nanometers to 500 nanometers, and for example, can be 150 nanometers; and further depositing the gate layer 108 including three layers of materials on the gate insulation layer 107 through sputtering, where the three layers of materials can include the lowermost molybdenum-columbium layer (with a thickness of approximately 30 nanometers), the middle copper layer (with a thickness of approximately 420 nanometers), and the uppermost molybdenum-columbium layer (with a thickness of approximately 30 nanometers), for example, and patterning the gate insulation layer 107 and the gate layer 108 in a self-alignment process.

Step S909, forming the interlayer insulation layer 109 through PECVD, where the interlayer insulation layer 109 can be made of silicon oxide, for example, and the thickness thereof can range from 100 nanometers to 500 nanometers, and for example, can be 300 nanometers, patterning the interlayer insulation layer 109, and etching the interlayer insulation layer 109 to form via holes for electrically connecting the source and the drain at the source-drain layer 110 with the active layer 106.

Step S9010, forming the surrounding layer and the source-drain layer 110 with a thickness of ranging from 50 nanometers to 400 nanometers through sputtering, and performing photolithograph and etching processes on them in a desirable pattern, where the surrounding layer is formed around the light-emitting layer 112 as an all-surrounding structure, for example, to block the light emitted from the light-emitting layer 112 and reflect the light emitted from the light-emitting layer 112 back into the electroluminescence structure 160 to thereby avoid the light emitted from the light-emitting layer 112 from being incident on the TFT 150 from a side thereof, while improving the light exit ratio of the electroluminescence structure 160; and the source and the drain at the source-drain layer 110 are electrically connected with the active layer 106 through the via holes running through the interlayer insulation layer 109.

Step S9011, depositing the layer structure 111 through PECVD, and patterning the layer structure 111, where the thickness of the layer structure 111 can range from 200 nanometers to 400 nanometers, and for example, can be 300 nanometers, and the layer structure can be both the passivation layer for protecting the TFT 150, and the pixel definition layer for insulating the respective electroluminescence structures 160 from each other. The layer structure 111 can be made of silicon oxide, for example, to thereby facilitate the uniformity of an inkjet-printed light-emitting material due to the hydrophobic characteristic of silicon oxide. After the layer structure 111 is etched using tetrafluoromethane and oxygen, it can be plasma-treated, for example, using oxygen or another plasma so that electrons in the ITO film of the first electrode are lost to thereby improve the work function of the first electrode so as to further improve the light exit efficiency of the light-emitting layer.

Step S9012, forming the light-emitting layer 112 in an inkjet printing process.

Step S9013, depositing the second electrode 113 on the light-emitting layer 112 in a vapor-plating process, where the second electrode 113 can be made of a metal material, e.g., aluminum.

Three number of mask processes can be dispensed while fabricating the array substrate as illustrated in FIG. 2 according to the embodiment of this disclosure as compared with the prior art, as depicted in Table 2 below, where the light-shielding layer 1041 in the light-shielding structure 170 can be an electrode in the electroluminescence structure 160 to thereby dispense with a mask process for further forming the electrode in the electroluminescence structure 160 separately; the layer structure 111 can be the passivation layer and the pixel definition layer so that the passivation layer and the pixel definition layer which would otherwise have been formed in two mask processes in the prior art can be formed in one mask process to thereby reduce the number of mask processes required for fabricating the array substrate, so as to simplify the method for fabricating the array substrate, and to reduce the thickness of the display panel; and the organic layer 103 for planarization can be between the thin film transistor and the base substrate to thereby avoid the organic layer 103 from being patterned, so as to dispense with a mask process.

TABLE 2

| Mask process | Process flow of fabricating the array substrate as illustrated in FIG. 1 | Process flow of fabricating the array substrate as illustrated in FIG. 2 |
| --- | --- | --- |
| 1 | Light-shielding layer 104 | First color filter 201 |
| 2 | Active layer 106 | Second color filter 202 |
| 3 | Gate insulation layer 107 and gate layer 108 | Third color filter 203 |
| 4 | Buffer layer 105 and interlayer insulation layer 109 | Light-shielding layer 104 and first electrode 1041 |
| 5 | Contact hole CNT 7031 | Buffer layer 105 |
| 6 | Source-drain layer 110 | Active layer 106 |
| 7 | Color filter 712 corresponding to red light-emitting area | Gate insulation layer 107 and gate layer 108 |
| 8 | Color filter 712 corresponding to green light-emitting area | Interlayer insulation layer 109 |
| 9 | Color filter 712 corresponding to blue light-emitting area | Surrounding layer and source-drain layer 110 |
| 10 | Passivation layer 704 | Layer structure 111 |
| 11 | Via hole 7051 at organic layer 103 | |
| 12 | Anode layer 713 | |
| 13 | Pixel definition layer 706 | |

Figure 10:
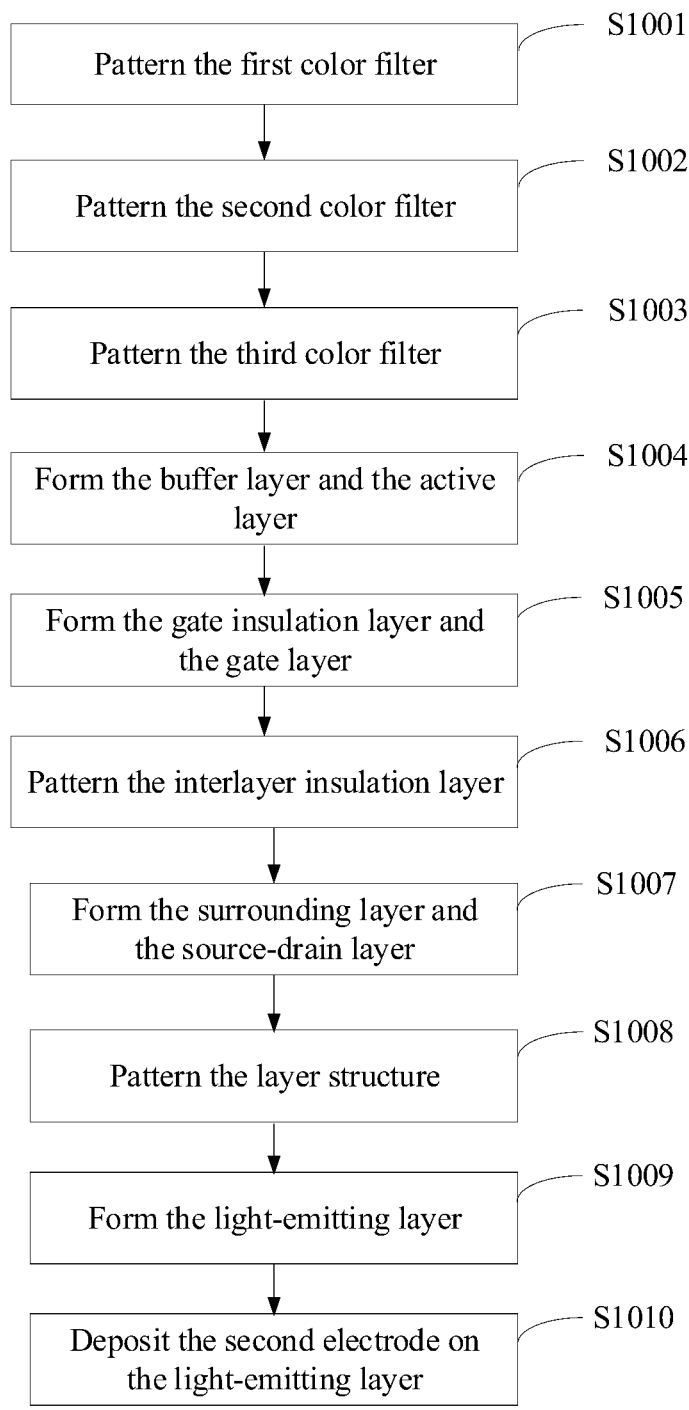
FIG. 10 is a fifth flow chart of the method for fabricating an array substrate according to an embodiment of this disclosure.

As illustrated in FIG. 10, a method for fabricating the array substrate as illustrated in FIG. 10 can include the following steps.

Step S1001, patterning the first color filter 201 on the base substrate 101 in a patterning process (i.e., a mask process) to form the pattern of the first color filter 201.

Step S1002, patterning the second color filter 202 in a patterning process to form the pattern of the second color filter 202 on one side of the first color filter 201 away from the base substrate 101.

Step S1003, patterning the third color filter 203 in a patterning process to form the pattern of the third color filter 203 on one side of the second color filter 202 away from the base substrate 101.

Step S1004, forming the buffer layer 105 through PECVD, where the buffer layer 105 can be made of a highly waterproof and oxygen-resistive organic material, but also can be the organic layer in the array substrate to thereby dispense with a mask process for patterning the organic layer separately, patterning the buffer layer 105, and forming the active layer 106 and the first electrode 1061 using the same mask, where the active layer 106 can be made of IGZO, for example, to thereby dispense with a mask process for patterning the first electrode 1061 layer separately.

Step S1005, forming the gate insulation layer 107 through PECVD, where the gate insulation layer 107 can be made of silicon oxygen, for example, and the thickness thereof can range from 100 nanometers to 500 nanometers, and for example, can be 150 nanometers; and further depositing the gate layer 108 including three layers of materials on the gate insulation layer 107 through sputtering, where the three layers of materials can include the lowermost molybdenum-columbium layer (with a thickness of approximately 30 nanometers), the middle copper layer (with a thickness of approximately 420 nanometers), and the uppermost molybdenum-columbium layer (with a thickness of approximately 30 nanometers), for example, and patterning the gate insulation layer 107 and the gate layer 108 in a self-alignment process.

Step S1006, forming the interlayer insulation layer 109 through PECVD, where the interlayer insulation layer 109 can be made of silicon oxide, for example, and the thickness thereof can range from 100 nanometers to 500 nanometers, and for example, can be 300 nanometers, patterning the interlayer insulation layer 109, and etching the interlayer insulation layer 109 to form via holes for electrically connecting the source and the drain at the source-drain layer 110 with the active layer 106.

Step S1007, forming the surrounding layer and the source-drain layer 110 with a thickness of ranging from 50 nanometers to 400 nanometers through sputtering, and performing photolithograph and etching processes on them in a desirable pattern, where the surrounding layer is formed around the light-emitting layer 112 as an all-surrounding structure, for example, to block the light emitted from the light-emitting layer 112 and reflect the light emitted from the light-emitting layer 112 back into the electroluminescence structure 160 to thereby avoid the light emitted from the light-emitting layer 112 from being incident on the TFT 150 from a side thereof, while improving the light exit ratio of the electroluminescence structure 160; and the source and the drain at the source-drain layer 110 are electrically connected with the active layer 106 through the via holes running through the interlayer insulation layer 109.

Step S1008, depositing the layer structure 111 through PECVD, and patterning the layer structure 111, where the thickness of the layer structure 111 can range from 200 nanometers to 400 nanometers, and for example, can be 300 nanometers, and the layer structure can be both the passivation layer for protecting the TFT 150, and the pixel definition layer for insulating the respective electroluminescence structures 160 from each other. The layer structure 111 can be made of silicon oxide, for example, to thereby facilitate the uniformity of an inkjet-printed light-emitting material due to the hydrophobic characteristic of silicon oxide. After the layer structure 111 is etched using tetrafluoromethane and oxygen, it can be plasma-treated, for example, using oxygen or another plasma so that electrons in the ITO film of the first electrode are lost to thereby improve the work function of the first electrode so as to further improve the light exit efficiency of the light-emitting layer.

Step S1009, forming the light-emitting layer 112 in an inkjet printing process.

Step S1010, depositing the second electrode 113 on the light-emitting layer 112 in a vapor-plating process, where the second electrode 113 can be made of a metal material, e.g., aluminum.

Five number of mask processes can be dispensed while fabricating the array substrate as illustrated in FIG. 3 according to the embodiment of this disclosure as compared with the prior art, as depicted in Table 3 below, where the first color filter 201 and/or the second color filter 202 and/or the third color filter 203 can be arranged above the base substrate as a light-shielding layer to thereby dispense with a mask process for further patterning the light-shielding layer separately; the first electrode can be formed while forming the active layer 1062, to thereby dispense with a mask process for further forming the first electrode layer separately; the layer structure 111 can be the passivation layer and the pixel definition layer, which can be formed in one mask process instead of two mask processes; and the buffer layer 105 can be also the organic layer, and the active layer 106 can be patterned in the same mask process as the organic layer to thereby dispense with a mask process for patterning the organic layer separately, and a mask process for patterning the active layer separately, so as to reduce the number of mask processes required for fabricating the array substrate, thus simplifying the method for fabricating the array substrate, and reducing the thickness of the display panel.

TABLE 3

| Mask process | Process flow of fabricating the array substrate as illustrated in FIG. 1 | Process flow of fabricating the array substrate as illustrated in FIG. 3 |
|---|---|---|
| 1 | Light-shielding layer 104 | First color filter 201 (also a light-shielding layer) |
| 2 | Active layer 106 | Second color filter 202 |
| 3 | Gate insulation layer 107 and gate layer 108 | Third color filter 203 |
| 4 | Buffer layer 105 and interlayer insulation layer 109 | Buffer layer 105 and active layer 106 (first electrode 1061 formed at the same layer as the active layer 106 using the same mask) |
| 5 | Contact hole CNT 7031 | Gate insulation layer 107 and gate layer 108 |
| 6 | Source-drain layer 110 | Interlayer insulation layer 109 |
| 7 | Color filter 712 corresponding to red light-emitting area | Surrounding layer and source-drain layer 110 |
| 8 | Color filter 712 corresponding to green light-emitting area | Layer structure 111 |
| 9 | Color filter 712 corresponding to blue light-emitting area | |
| 10 | Organic layer 103 and passivation layer 704 | |
| 11 | Via hole 7051 at organic layer 103 | |
| 12 | Anode layer 713 | |
| 13 | Pixel definition layer 706 | |

In summary, in the array substrate, the method for fabricating the same, the display panel, and the display device according to the embodiments of this disclosure, the first electrode and the light-shielding structure are formed using the same mask, or the first electrode, and the active layer in the thin film transistor are formed using the same mask, so that they can be formed at the same time to thereby reduce the number of mask processes required for fabricating the array substrate, so as to simplify a method for fabricating the array substrate. Furthermore the thickness of a display panel can be reduced, and the position, of the light-emitting layer, above on the first electrode, in the electroluminescence structure, relative to the base substrate can be lowered to thereby alleviate or avoid light emitted from the light-emitting layer from being incident on the thin film transistor in the array substrate to thereby improve the stability of the thin film transistor for illumination, and optimize the performance of the display panel.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. An array substrate, comprising:
   a base substrate; and
   at least one pixel element on one side of the base substrate, each of the at least one of pixel element comprises: a thin film transistor, an electroluminescence structure and a light-shielding structure between the thin film transistor and the base substrate;
   wherein, the thin film transistor comprises a drain and an active layer;
   at least one insulation layer on one side of the base substrate near the at least one of pixel element; wherein a surface of the at least one insulation away from the base substrate comprises a recessed portion, and the electroluminescence structure is in the recessed portion;
   each of the at least one of pixel element comprises a light-emitting area, and a circuit area adjacent to the light-emitting area; wherein the thin film transistor is in the circuit area, and the electroluminescence structure is in the light-emitting area;
   the active layer is between the base substrate and the at least one insulation layer;
   the drain is on one side of the at least one insulation layer away from the base substrate, and the drain covers at least a portion of a sidewall of the recessed portion for preventing light emitted by the electroluminescence structure from being incident on the active layer;
   wherein the electroluminescence structure comprises a first electrode configured to drive the pixel element and one of the light-shielding structure and the active layer is at a same layer as the first electrode.

2. The array substrate according to claim 1, wherein the drain covers all of the sidewall of the recessed portion.

3. The array substrate according to claim 1, wherein the at least one insulation layer comprises an interlayer insulation layer, and the recessed portion penetrates through the interlayer insulation layer.

4. The array substrate according to claim 3, wherein,
   the electroluminescence structure comprises a first electrode;
   the first electrode is on the bottom of the recessed portion near the base substrate; and
   the first electrode and the active layer are in a same layer and are made of a same material.

5. The array substrate according to claim 1, wherein the at least one insulation layer comprises an interlayer insulation layer and a buffer layer;
   wherein the buffer layer is between the interlayer insulation and the base substrate, and the recessed portion penetrates through the interlayer insulation layer and the buffer layer.

6. The array substrate according to claim 5, further comprising:
   a light-shielding layer between the buffer layer and the base substrate;
   wherein an orthographic projection of the light-shielding layer on the base substrate overlaps with a part of or all of an orthographic projection of the active layer on the base substrate, and the light-shielding layer is configured to prevent light from being incident on the active layer;

wherein the electroluminescence structure comprises a first electrode, the first electrode is on the bottom of the recessed portion near the base substrate, and the first electrode and the light-shielding layer are in a same layer and are made of a same material.

7. The array substrate according to claim 1, further comprising:

an organic layer between the base substrate and the at least one insulation layer, wherein the light-shielding structure is between the organic layer and the base substrate;

wherein an orthographic projection of the light-shielding structure on the base substrate overlaps with a part of or all of an orthographic projection of the active layer on the base substrate, and the light-shielding structure is configured to prevent light from being incident on the active layer.

8. The array substrate according to claim 1, the light-shielding structure comprises: a filter structure between the thin film transistor and the base substrate, and a light-shielding layer between the filter structure and the thin film transistor; and the first electrode and the light-shielding layer are at the same layer.

9. The array substrate according to claim 8, wherein the filter structure comprises one or a combination of:

a first color filter on the base substrate;

a second color filter on one side of the first color filter away from the base substrate; or a third color filter on one side of the second color filter away from the base substrate.

10. The array substrate according to claim 1, wherein on the condition that the first electrode and the active layer are at the same layer, the light-shielding structure comprises one or a combination of:

a first color filter on the base substrate;

a second color filter on one side of the first color filter away from the base substrate; or a third color filter on one side of the second color filter away from the base substrate.

11. The array substrate according to claim 1, wherein the array substrate further comprises a first color filter or a second color filter or a third color filter between the electroluminescence structure and the base substrate.

12. The array substrate according to claim 1, wherein the electroluminescence structure further comprises: a second electrode opposite to the first electrode, and a light-emitting layer between the first electrode and the second electrode.

13. The array substrate according to claim 12, wherein the thin film transistor further comprises a source-drain layer on one side of the active layer away from the base substrate; wherein the source-drain layer is higher than the light-emitting layer on a plane parallel to the base substrate.

14. The array substrate according to claim 13, wherein the array substrate further comprises a layer structure between the second electrode and the source-drain layer, wherein the layer structure is a passivation layer and a pixel definition layer.

15. A display panel, comprising the array substrate according to claim 1.

16. A display device, comprising the display panel according to claim 15.

* * * * *